US006893912B2

(12) United States Patent
Lung

(10) Patent No.: US 6,893,912 B2
(45) Date of Patent: May 17, 2005

(54) FERROELECTRIC CAPACITOR MEMORY DEVICE FABRICATION METHOD

(75) Inventor: Hsiang-Lan Lung, Hsinchu (CN)

(73) Assignee: Macronix International Co., Ltd., Hsinchu (TW)

( * ) Notice: Subject to any disclaimer, the term of this patent is extended or adjusted under 35 U.S.C. 154(b) by 82 days.

(21) Appl. No.: 10/270,997

(22) Filed: Oct. 15, 2002

(65) Prior Publication Data

US 2004/0072407 A1 Apr. 15, 2004

(51) Int. Cl.[7] .......................................... H01L 21/8242
(52) U.S. Cl. ....................... 438/240; 438/3; 438/210; 438/253; 438/256; 438/396; 438/399
(58) Field of Search ........................... 438/3, 240, 210, 438/253, 256, 396, 399; 257/295, 310

(56) References Cited

U.S. PATENT DOCUMENTS

| | | | |
|---|---|---|---|
| 5,046,043 A | | 9/1991 | Miller et al. |
| 5,119,154 A | | 6/1992 | Gnadinger |
| 5,273,927 A | | 12/1993 | Gnadinger |
| 5,589,284 A | | 12/1996 | Summerfelt et al. |
| 5,817,170 A | | 10/1998 | Desu et al. |
| 5,854,104 A | | 12/1998 | Onishi et al. |
| 5,963,466 A | | 10/1999 | Evans, Jr. |
| 5,998,236 A | | 12/1999 | Roeder et al. |
| 6,075,264 A | | 6/2000 | Koo |
| 6,485,988 B2 | * | 11/2002 | Ma et al. ........................ 438/3 |
| 6,627,931 B1 | * | 9/2003 | Casagrande et al. ......... 257/295 |
| 2002/0033494 A1 | * | 3/2002 | Ozaki et al. ................. 257/295 |
| 2002/0045311 A1 | * | 4/2002 | Mikawa ....................... 438/240 |
| 2002/0196653 A1 | * | 12/2002 | Kim et al. .................... 365/100 |

OTHER PUBLICATIONS

S.L. Lung et al, Low Temperature Epitaxial Growth of PZT on Conductive Perovskite LaNiO, Electrode for Embedded Capacitor–Over–Interconnect (COI) FeRAM Application, Abstract, IEDM Conference, Dec., 2001.

* cited by examiner

Primary Examiner—Mary Wilczewski
Assistant Examiner—Toniae M. Thomas
(74) Attorney, Agent, or Firm—Haynes Beffel & Wolfeld LLP

(57) ABSTRACT

A ferroelectic capacitor memory device is fabricated by a forming a substrate including integrated circuitry with an interconnect layer and pass transistors. First capacitor electrodes, contacts and pads are simultaneously formed on the substrate and are connected to an associated pass transistor through the interconnect layer. A ferroelectic dielectric layer, formed on the first capacitor electrodes, is patterned to expose portions of one of the contacts and one of the pads to form a contact opening and a pad region. A second capacitor electrode is formed over the patterned ferroelectric layer to create a via within said contact opening, the via extending to one of the contacts. A conductive layer is formed upon the second capacitor electrode. The conductive layer is patterned to form a plate line, the via connecting one of the contacts to the plate line. The substrate forming step may be carried out so that the pass transistors comprise sources, drains and gates and the integrated circuitry comprises complementary metal oxide semiconductor (CMOS) circuitry comprising word lines, bit lines interconnect metal lines and contact plugs.

12 Claims, 9 Drawing Sheets

FERROELECTRIC CAPACITOR MEMORY DEVICE FABRICATION METHOD

CROSS-REFERENCE TO RELATED APPLICATION

This application is related to a copending patent application, filed on the same day as this application and having the same assignee, entitled "Ferroelectric Device and Method for Making", Ser. No. 10/271,241.

BACKGROUND OF THE INVENTION

Computer memories may be classified as either volatile, that is memories that lose their stored information when power is removed, or non-volatile, that is memories that retain their stored information when power is removed. One type of nonvolatile memory uses a ferroelectric dielectric layer within the device. The direction of polarization of these ferroelectric capacitor memory devices, commonly called FeRAM, is used to determine its binary storage state.

FeRAM is considered an ideal memory because of its low power consumption, low operation voltage, high writing speed and high endurance. Traditionally, the ferroelectric capacitor is fabricated before the CMOS interconnect process because ferroelectric materials, such as lead zirconate titanate (PZT) and $SrBi_2TaO_9$ (SBT), require high temperature treatment (>600° C.) to crystallize into ferroelectric phases. However, the plasma and hydrogen-containing atmospheres used in CMOS interconnect processes damage the ferroelectric capacitor and decrease the reliability of FeRAM (Takashi Hase, Takehiro Noguchi and Yoichi Miyasaka, "Analysis of The Degradation of PZT and $SrBi_2TaO_9$ Thin Films with A Reductive Process," Integrated Ferroelectric, 16, pp. 29–40, 1997). The COI (Capacitor Over Interconnect) process is attractive because it eliminates the backend process damage to the ferroelectric capacitor. However, since interconnect cannot withstand high temperature required for crystallizing PZT into the perovskite phase, COI can only be implemented if PZT can be crystallized at low temperature. Recently, lower temperature processes have been proposed, such as MOCVD-PZT (S. Kobayashi, K. Amanuma, H. Mori, N. Kasai, Y. Maejima, A. Seike, N. Tanabe, T. Tatsumi, J. Yamada, T. Miwa, H. Koike, H. Hada and Toyoshima, "64 Kbit CMVP FeRAM Macro with Reliable Retention/Imprint Characteristics," IEDM'00 Tech Digest, pp. 783–786, 2000), or $O_2$ free sputtering (Naoya Inoue, Takeshi Nakura and Yoshihiro Hayashi, "Low Thermal-budget Fabrication of Sputtered-PZT Capacitor on Multilevel Interconnects for Embedded FeRAM", IEDM'00 Tech Digest, pp. 797–800, 2000), but even these improvements still require processing temperature in the range of 430° C. to 475° C. which is still too high for CMOS interconnect, especially for advanced low k application.

See S. L. Lung, C. L. Liu, et al, "Low Temperature Epitaxial Growth of PZT on Conductive Perovskite $LaNiO_3$ Electrode for Embedded Capacitor-Over-Interconnect (COI) FeRAM Application", IEDM 01 Tech Digest, pp 275–278, 2001.

SUMMARY OF THE INVENTION

The invention is directed to a method for fabricating a ferroelectric capacitor memory device. A substrate is formed including integrated circuitry with an interconnect layer and pass transistors. First capacitor electrodes, contacts and pads are simultaneously formed on the substrate, the first capacitor electrodes being connected to associated pass transistors though the interconnect layer. A ferroelectric dielectric layer is formed on the first capacitor electrodes. The ferroelectric dielectric layer is patterned to expose portion of a chosen one of the contacts to form a contact opening and to expose a portion of a chosen one of the pads to form a pad region. A second capacitor electrode is formed over the patterned ferroelectric layer to create a via within said contact opening, said via extending to said chosen one of the contacts. A conductive layer is formed upon the second capacitor electrode. The conductive layer is patterned to form a plate line, said via connecting the chosen one of the contacts to said plate line. The substrate forming step may be carried out so that the pass transistors comprise surces, drains and gates and the integrated circuity comprises complementary metal oxide semiconductor (CMOS) circuitry comprising word lines, bit lines, interconnect metal lines and contact plugs. A passivation layer may be formed upon the patterned conductive layer. The first capacitor electrode forming step may be carried out to form a first capacitor electrode comprising one or more of barrier, platinum and $LaNiO_3$ (LNO). The ferroelectric dielectric layer may, for example, comprise lead zirconate titanate (PZT), lead lanthanum zirconate titanate (PLZT) or $SrBi_2TaO_9$ (SBT), or an appropriate combination thereof.

The present invention may provide several advantages over conventional structures. By using a conductive perovskite $LaNiO_3$ (LNO) bottom electrode as a seed layer, the crystallization temperature of in-situ sputter deposited PZT has been greatly reduced from about 600° C. to about 350° C. to 400° C. LNO has the same crystal structure as PZT with small (<5%) lattice mismatch. LNO's near-perfect lattice match with PZT allows PZT to growth epitaxially at low temperature. The 2Pr value of the low temperature grown PZT is about 20 $C./cm^2$, and this provides 130 mV–400 mV sense margin when bit line capacitance is 800 fF. When Pt is used as the top electrode, an amorphous layer, which degrades the electric fatigue performance, is found at the interface of Pt and PZT. When the top electrode is replaced by LNO, the thickness of the amorphous layer is decreased, and fatigue performance is improved. COI FeRAM structure can be easily achieved by this low temperature capacitor process, and is suitable for advanced Cu/low-K embedded logic applications. While LNO and PZT are presently generally preferred, other materials exhibiting similar properties of low crystalization temperature, same crystal structure and close lattice match may be used.

Other features and advantages will appear from the following description in which preferred embodiments and methods have been set forth in detail in conjunction with the accompanying drawings.

DETAILED DESCRIPTION OF THE INVENTION

Figure 1:
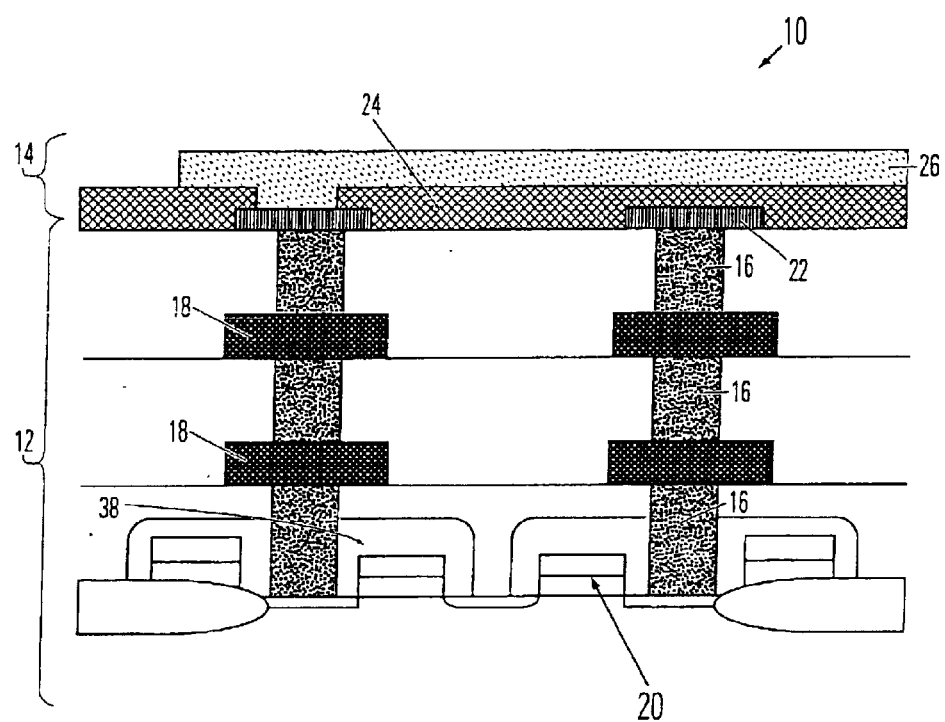
FIG. 1 is a simplified cross-sectional schematic view of a ferroelectric capacitor memory device made according to the invention.

FIG. 1 illustrates a ferroelectric capacitor memory device 10 to include an IC layer 12, typically a CMOS IC layer, and a ferroelectric subassembly 14. IC layer 12 comprises contact plugs 16, interconnect lines 18, and pass transistor 20 electrically coupled to ferroelectric subassembly 14 through contact plugs 16 and lines 18. The construction of IC layer 12 may be conventional.

Ferroelectric subassembly 14 includes first, second and third layers 22, 24 and 26 formed upon the IC layer 12. First and third layers 22, 26 comprise first and second capacitor electrodes while second layer 24 is made of a ferroelectric material. The deposition of first layer 22 also creates contact 23 and pad 44 (shown in FIG. 3). First and second capacitor electrodes 22, 26 are preferably made of LaNiO3 (LNO). Second layer 24 may comprise lead zirconate titanate (PZT), or lead lanthanum zirconate titanate (PLZT), or SrBi2TaO9 (SBT), or an appropriate combination thereof. Other ferroelectric materials known now or discovered in the future may also be appropriate. At least the portion of first layer 22 contacting second layer 24 has the same crystal structure as the second layer so that first layer 22 acts as both a seed layer for the ferroelectric material of second layer 24 and as a capacitor electrode.

Any lattice mismatch between the first and second layers is preferably less than about 5 percent. This small lattice mismatch permits deposition at low temperatures, preferably less than about 400° C., such as about 350° C.–400° C. This low temperature permits formation of the ferroelectric capacitor on top of metal interconnects to create a construction termed capacitor over interconnect (COI). The low deposition temperature also reduces reactions between electrodes and the ferroelectric material and improves the reliability of ferroelectric capacitor memory device 10. Because ferroelectric subassembly 14 is formed after fabrication of interconnect layer 34 (discussed below with reference to FIG. 2), damage to the ferroelectric material during such fabrication steps is avoided.

Figure 2:
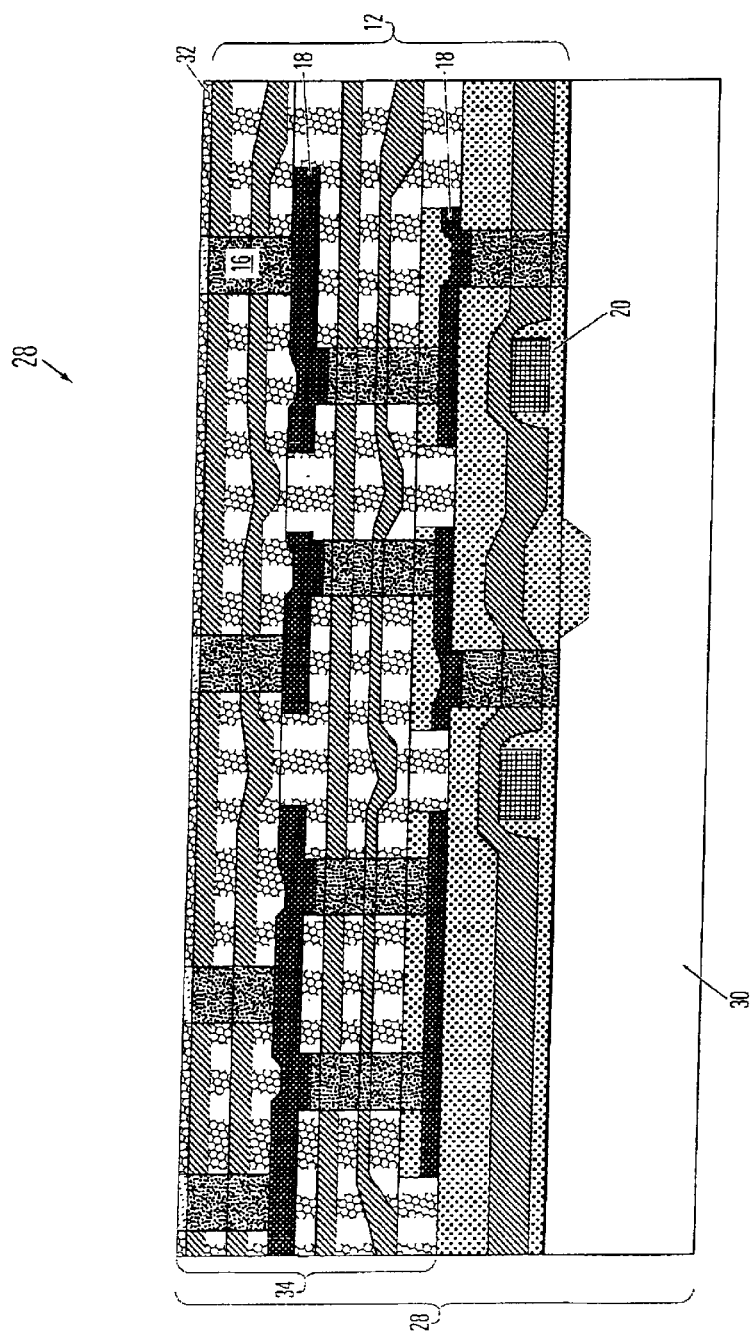
FIGS. 2–8 are cross-sectional views illustrating the steps involved in the fabrication of one example of a ferroelectric capacitor memory device made according to the invention, the device shown in its completed state in FIG. 8, FIG. 8 being taken along line 8—8 of FIG. 9.

FIG. 2 illustrates a substrate 28 with CMOS circuitry 30. The upper surface of substrate 28 comprises a barrier layer 32, typically made of, for example, platinum/titanium; other materials such as Ir/TiAlN or IrO$_2$/Ir/TiAlN, or a suitable combination thereof, may be used for barrier layer 32. Barrier layer 32 is used to prevent oxidation of contact plugs 16 and promote adhesion. Substrate 28 comprises an interconnect layer 34 as a part of IC layer 12. Within IC layer 12 are pass transistors 20 coupled to barrier layer 32 by contact plugs 16 and interconnect lines 18.

Figure 3:
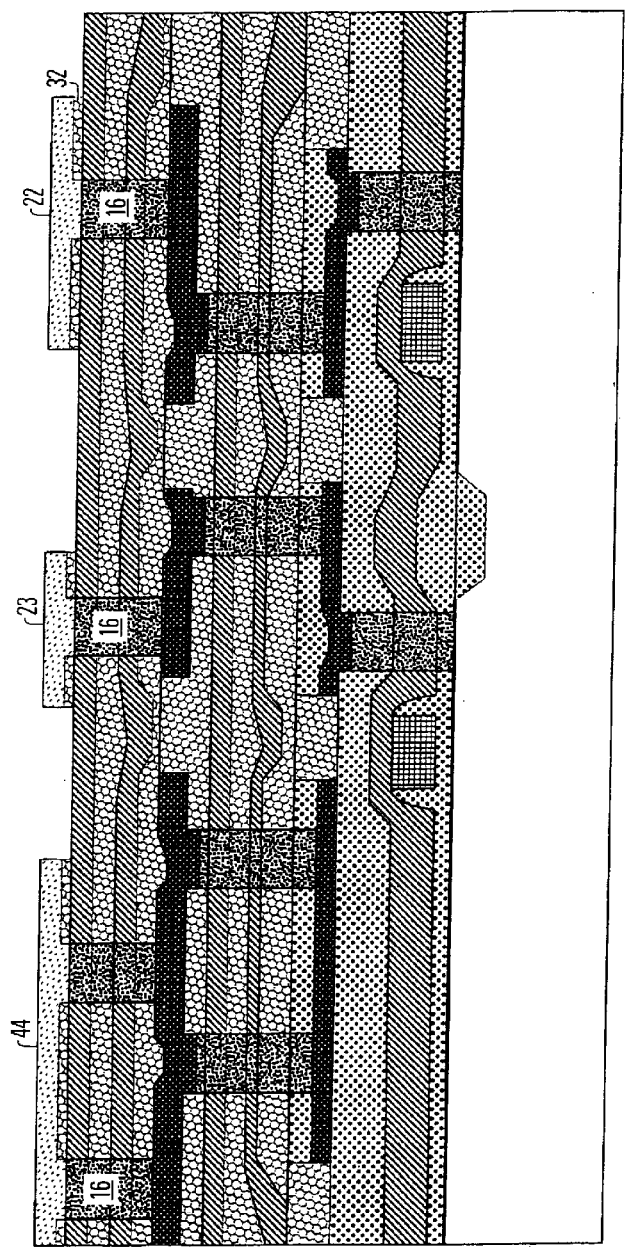

FIG. 3 illustrates the results of patterning and deposition of first capacitor electrodes 22, contacts 23 and pads 44 onto barrier layer 32 of IC layer 12 and in electrical contact with contact plugs 16. Barrier layer 32 has been removed in regions other than first capacitor electrodes 22 and pads 44 during the deposition of first capacitor electrodes 22 and pads 44. The first electrode 22, contact 23 and pad 44 are sputter deposited on barrier layer 32 at 350° C. in Ar/O2 gas using an LNO ceramic target made by sintering La2O3 and NiO powder at 1000° C. Based on XRD analysis, the 350° C. in-situ sputter deposited LNO is pure perovskite phase. With an electrical resistivity of about 300 $\mu$ohm-cm, LNO serves as a good electrode material. A ceramic PZT target, with 10% excess Pb and a Zr/Ti ratio equal to 53/47, is used to sputter the PZT constituting second layer 24 in this example. Pure argon is used because oxygen was found to suppress the formation of perovskite phase (Naoya Inoue, Takeshi Nakura and Yoshihiro Hayashi, "Low Thermal-budget Fabrication of Sputtered-PZT Capacitor on Multilevel Interconnects for Embedded FeRAM," IEDM'00 Tech Digest, pp. 797–800, 2000).

Figure 4:
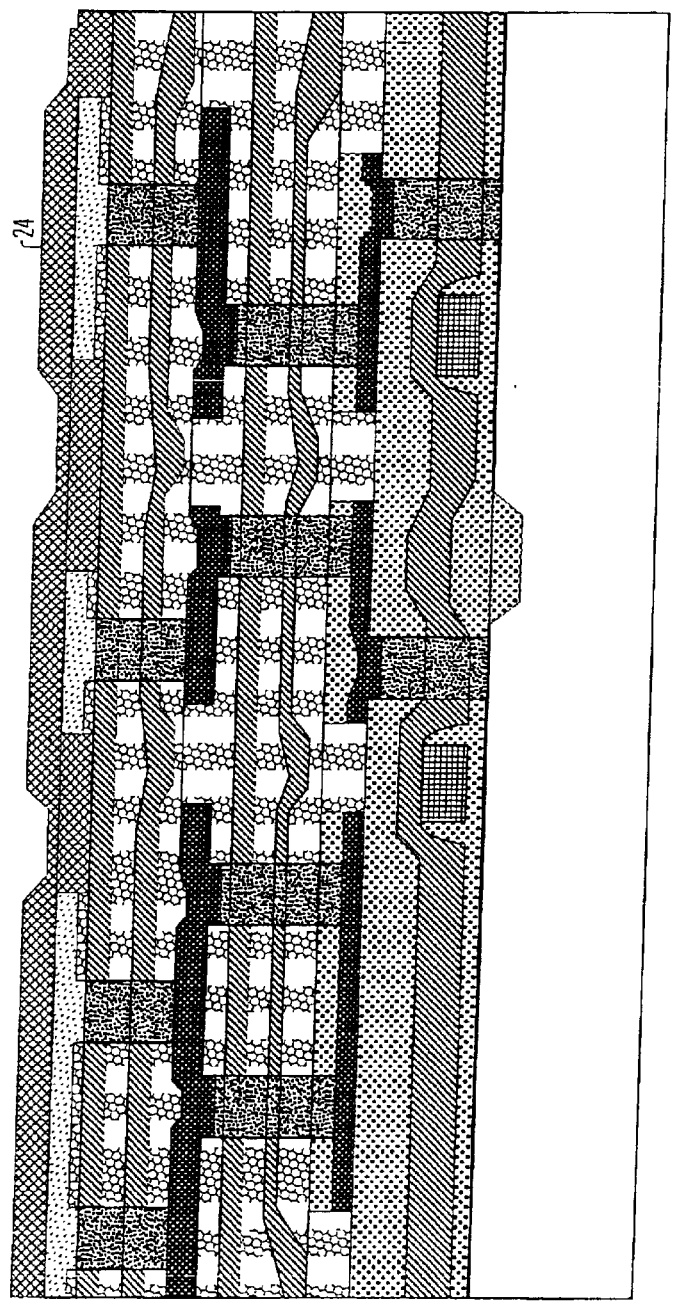
Figure 5:
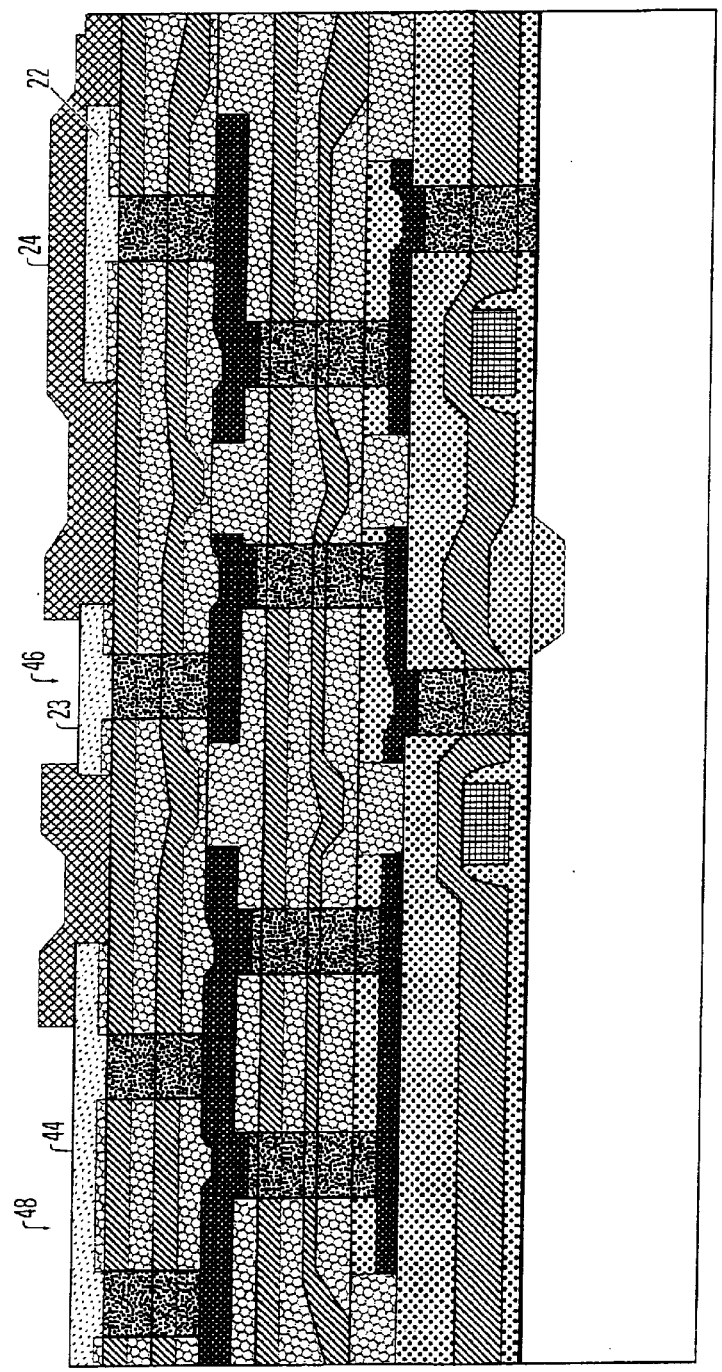
Figure 6:
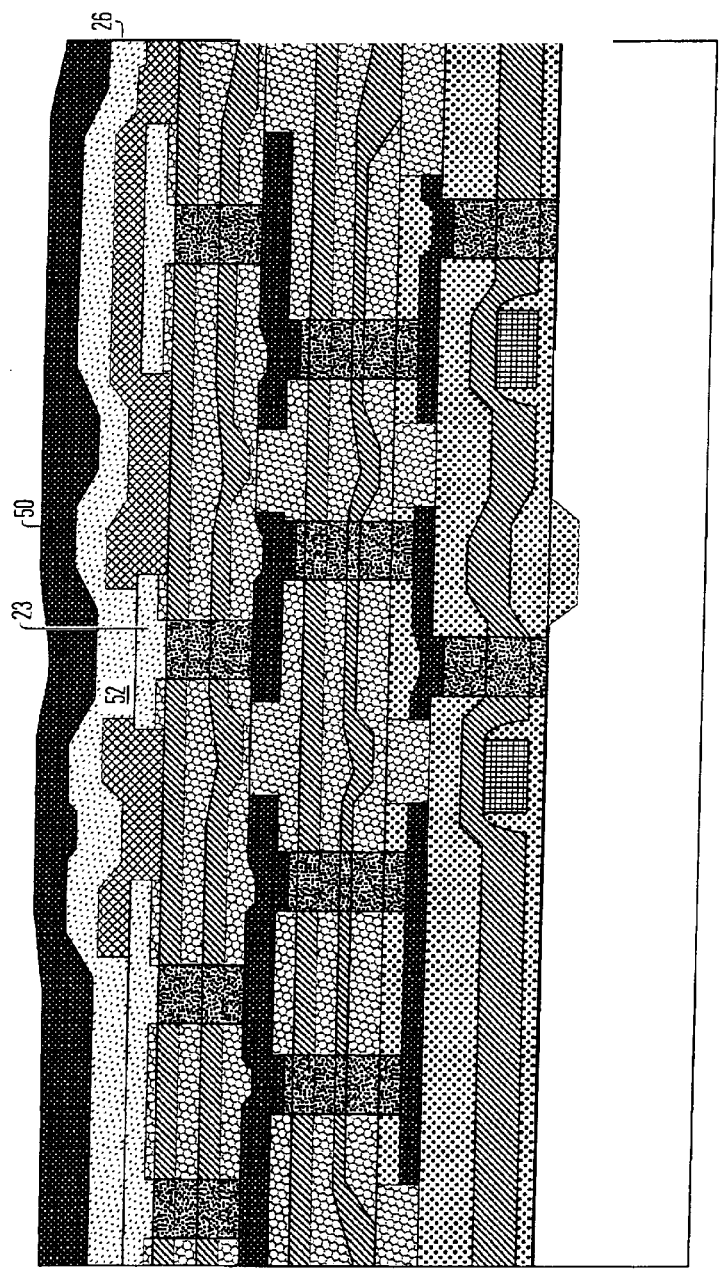
Figure 7:
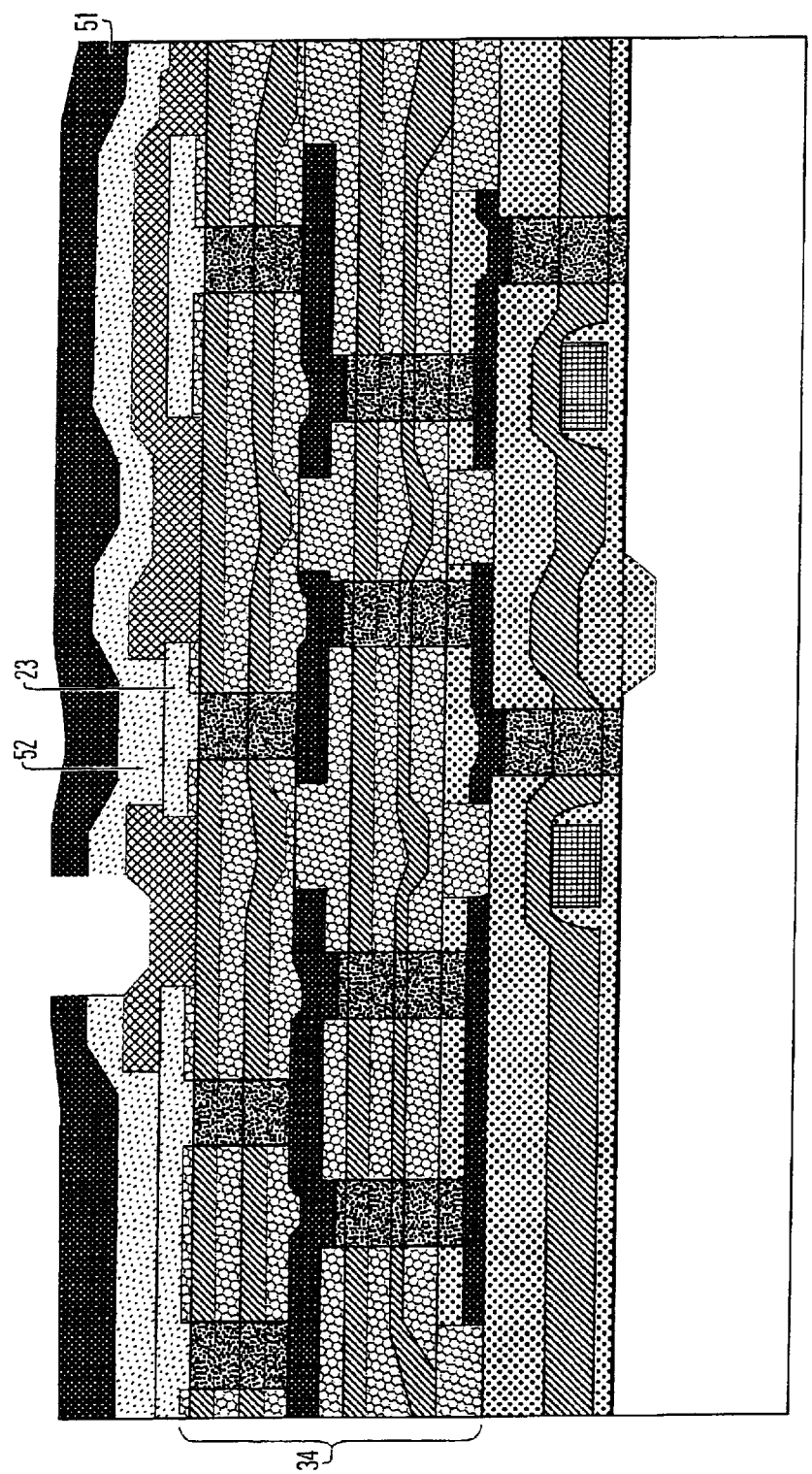
Figure 8:
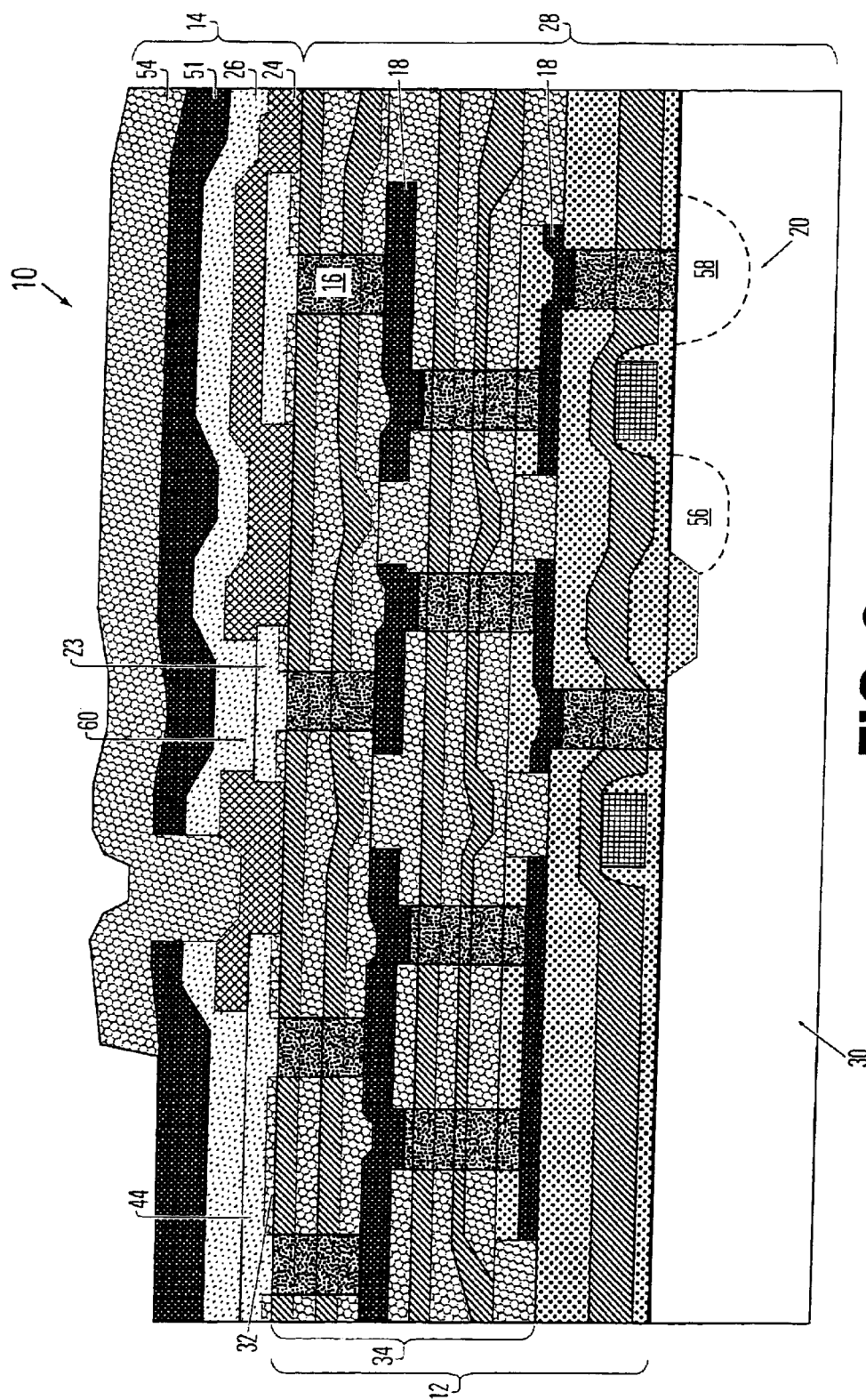
Figure 9:
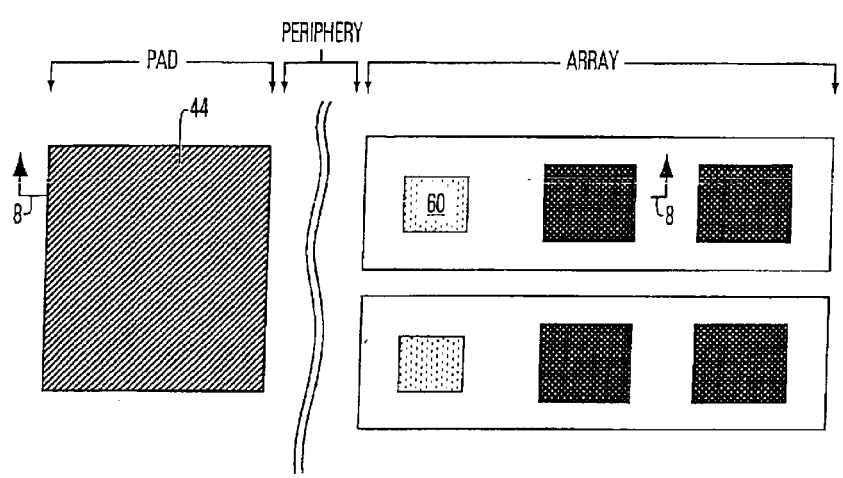
FIG. 9 is a simplified top view of the ferroelectric capacitor memory device of FIG. 8.

FIG. 4 illustrates the results of the deposition of second layer 24 made of ferroelectric material, PZT in this example, at about 400° C. It has been found that when first capacitor electrode 22 and second layer 24 are made of LNO and PZT, respectively, PZT grows epitaxially from the underlying LNO of first capacitor electrode 22 at a deposition temperature of about 350° C.–400° C. FIG. 5 illustrates the results of patterning second layer 24 to form contact openings 46 above contacts 23 and pad openings 48 above pads 44. Second layer 24 acts as a ferroelectric dielectric layer. FIG. 6 illustrates the results of depositing second capacitor electrode 26 to create a via 52 within contact opening 46. Via 52 extends to contact 23. This is followed by depositing a conductive layer 50 onto second capacitor electrode 26. FIG. 7 illustrates the results of patterning conductive layer 50 at appropriate positions through conductive layer 50, patterned conductive layer 50 now called plate line 51. Via 52 connects contact 23 to plate line 51. Finally, FIG. 8 illustrates the finished ferroelectric capacitor memory device 10 with the deposition of a passivation layer 54, typically made of SiO2/Al2O3 or SiN/SiO2/Al2O3, and the creation of plate line contact 60 at via 52 connecting plate line 51 and contact 23. Pass transistor 20 comprises source 56 and drain 58 coupled to interconnect lines 18 (the interconnect lines comprising bit lines) and contact plugs 16. FIG. 9 illustrates, in simple form, where the cross-sectional view of FIG. 8 is taken.

Modifications and variations can be made to be disclosed embodiments without departing from the subject of the invention as defined in the following claims. For example, appropriate materials other than LaNiO$_3$ (LNO) may be used for one or both of the first and second capacitor electrodes 22, 26, appropriate materials other than lead zirconate titanate (PZT), lead lanthanum zirconate titanate (PLZT), and SrBi$_2$TaO$_9$ (SBT) may be used for second layer 24, and appropriate materials other than platinum/titanium may be used for barrier layer 32. While it is preferred that the ferroelectric subassembly 14 be formed at temperatures of less than about 400° C., higher temperatures may be found suitable for part or all of the deposition procedures for ferroelectric subassembly 14.

Any and all patents, patent applications and printed publications referred to above are incorporated by reference.

What is claimed is:

1. A method for fabricating a ferroelectric capacitor memory device comprising:

forming a substrate comprising integrated circuitry including an interconnect layer and pass transistors;

simultaneously forming first capacitor electrodes, contacts and pads on said substrate, said first capacitor electrodes being connected to associated pass transistors through said interconnect layer;

forming a ferroelectric dielectric layer upon said first capacitor electrodes, contacts and pads;

patterning said ferroelectric dielectric layer to (a) expose a portion of a chosen one of said contacts to form a contact opening, and (b) expose a portion of a chosen one of said pads to form a pad region;

forming a second capacitor electrode over said patterned ferroelectric dielectric layer to create a via within said contact opening, said via extending to said chosen one of said contacts;

forming a conductive layer upon said second capacitor electrode; and patterning said conductive layer, to form a plate line, said via connecting said chosen one of said contacts to said plate line.

2. The method according to claim 1 wherein:

said substrate forming step is, carried out so that the pass transistors comprise sources and drains, and the integrated circuitry comprises complementary metal oxide semiconductor (CMOS) circuitry comprising word lines, bit lines, interconnect metal lines, and contact plugs;

said substrate forming step is carried out to form an inter-layer dielectric layer over said CMOS circuitry;

said first capacitor electrodes forming step is carried out on said inter-layer dielectric layer;

said contact plugs connecting said chosen of said contacts to said bit lines; and said contact plugs connecting said first capacitor electrodes to said interconnect metal lines.

3. The method according to claim 1 wherein:

said substrate forming step is carried out so that the pass transistors comprise sources and drains, and the integrated circuitry comprises complementary metal oxide semiconductor (CMOS) circuitry comprising word lines, bit lines and contact plugs;

said substrate forming step is carried out to form an interconnect layer over said CMOS circuitry, said interconnect layer comprising interconnect lines;

said first capacitor electrodes forming step is carried out on said interconnect layer; and said contact plugs connecting said bit lines to said selected ones of said contacts.

4. The method according to claim 1 further comprising the step of forming a passivation layer upon said patterned conductive layer.

5. The method according to claim 4 further comprising opening the passivation layer to expose the pad.

6. The method according to claim 1 wherein said first capacitor electrode forming step is carried out to create a platinum-containing first capacitor electrode.

7. The method according to claim 1 wherein said first capacitor electrode forming step is carried out to create an $LaNiO_3$-containing (LNO-containing) first capacitor electrode.

8. The method according to claim 1 further comprising selecting lead zirconate titanate (PZT) as a material for said ferroelectric dielectric layer.

9. The method according to claim 1 further comprising selecting lead lanthanum zirconate titanate (PLZT) as a material for said ferroelectric dielectric layer.

10. The method according to claim 1 further comprising selecting $SrBi_2TaO_9$ (SBT) as a material for said ferroelectric dielectric layer.

11. The method according to claim 1 wherein said second capacitor electrode forming step is carried out to create a platinum-containing second capacitor electrode.

12. The method according to claim 1 wherein said conductive layer forming step is carried out to create an aluminum-containing conductive layer.

* * * * *